United States Patent [19]
Vergnes et al.

[11] Patent Number: 5,977,805
[45] Date of Patent: Nov. 2, 1999

[54] FREQUENCY SYNTHESIS CIRCUIT TUNED BY DIGITAL WORDS

[75] Inventors: Alain Vergnes, Trets; Didier Valenti, Marseilles, both of France

[73] Assignee: Atmel Corporation, San Jose, Calif.

[21] Appl. No.: 09/010,434

[22] Filed: Jan. 21, 1998

[51] Int. Cl.[6] .................................................. H03B 21/00
[52] U.S. Cl. .......................... 327/107; 327/271; 327/276; 327/407
[58] Field of Search .................................... 327/105, 107, 327/241, 269, 276, 284, 277, 156, 147, 407, 270, 271, 149, 152, 161; 331/34; 375/327, 373–376

[56] References Cited

U.S. PATENT DOCUMENTS

| | | | |
|---|---|---|---|
| 4,241,308 | 12/1980 | Cellier et al. | 327/114 |
| 4,777,385 | 10/1988 | Hartmeier | 327/407 |
| 4,825,109 | 4/1989 | Reynolds | 327/271 |
| 5,049,766 | 9/1991 | Van Driest | 327/269 |
| 5,097,489 | 3/1992 | Tucci | 375/374 |
| 5,448,191 | 9/1995 | Meyer | 327/105 |
| 5,537,069 | 7/1996 | Volk | 327/149 |
| 5,553,100 | 9/1996 | Saban et al. | 375/340 |
| 5,561,692 | 10/1996 | Maitland et al. | 375/371 |
| 5,592,515 | 1/1997 | Saban et al. | 375/340 |
| 5,656,958 | 8/1997 | Albert et al. | 327/105 |

OTHER PUBLICATIONS

H. T. Nicolas, III et al., "A 150–MHz Direct Digital Frequency Synthesizer in 1.25–$\mu$m CMOS with—90–dBc Spurious Performance", *IEEE Journal of Solid–State Circuits*, vol. 26, No. 12, Dec. 1991 pp. 1959–1969.

L. A. Laurich, "Phase Lock Loop With Variable Delay Line Oscillator", *IBM Technical Disclosure Bulletin*, vol. 13, No. 7, Dec. 1970, pp. 1861–1862.

L. A. Laurich et al., "Phase Lock Loop With Delay Line Oscillator", *IBM Technical Disclosure Bulletin*, vol. 13, No. 7, Dec. 1970, pp. 1863–1864.

*Primary Examiner*—Kenneth B. Wells
*Assistant Examiner*—Minh Nguyen
*Attorney, Agent, or Firm*—Thomas Schneck; Mark Protsik

[57] ABSTRACT

A direct digital frequency synthesizer featuring an accumulator having a modulo overflow signal addressing a multiplexer. The multiplexer receives a series of delay signals generated from digital circuits. The delay signals establish the phase of a reference oscillator. The number of units of delay are sufficient to resolve expected jitter. The accumulator is a digital counter which increments by only a single digit for each count, such as a Gray code counter. In one embodiment, the delay signals are generated by a charge pump feeding individual logic circuits driving integrated capacitors in a loop. Feedback to the charge pump establishes that the total delay will subdivide a single clock cycle of the reference clock. In a second embodiment, a single shifter or several shifters, with output in phase reversal relation, subdivide a single clock cycle. A clock multiplier and divider are used to assure the synchronism of each clock cycle with the total number of units of delay. The output of the multiplexer is the reference oscillator signal, adjusted by the phase delay, forming a synthesized output frequency.

31 Claims, 6 Drawing Sheets

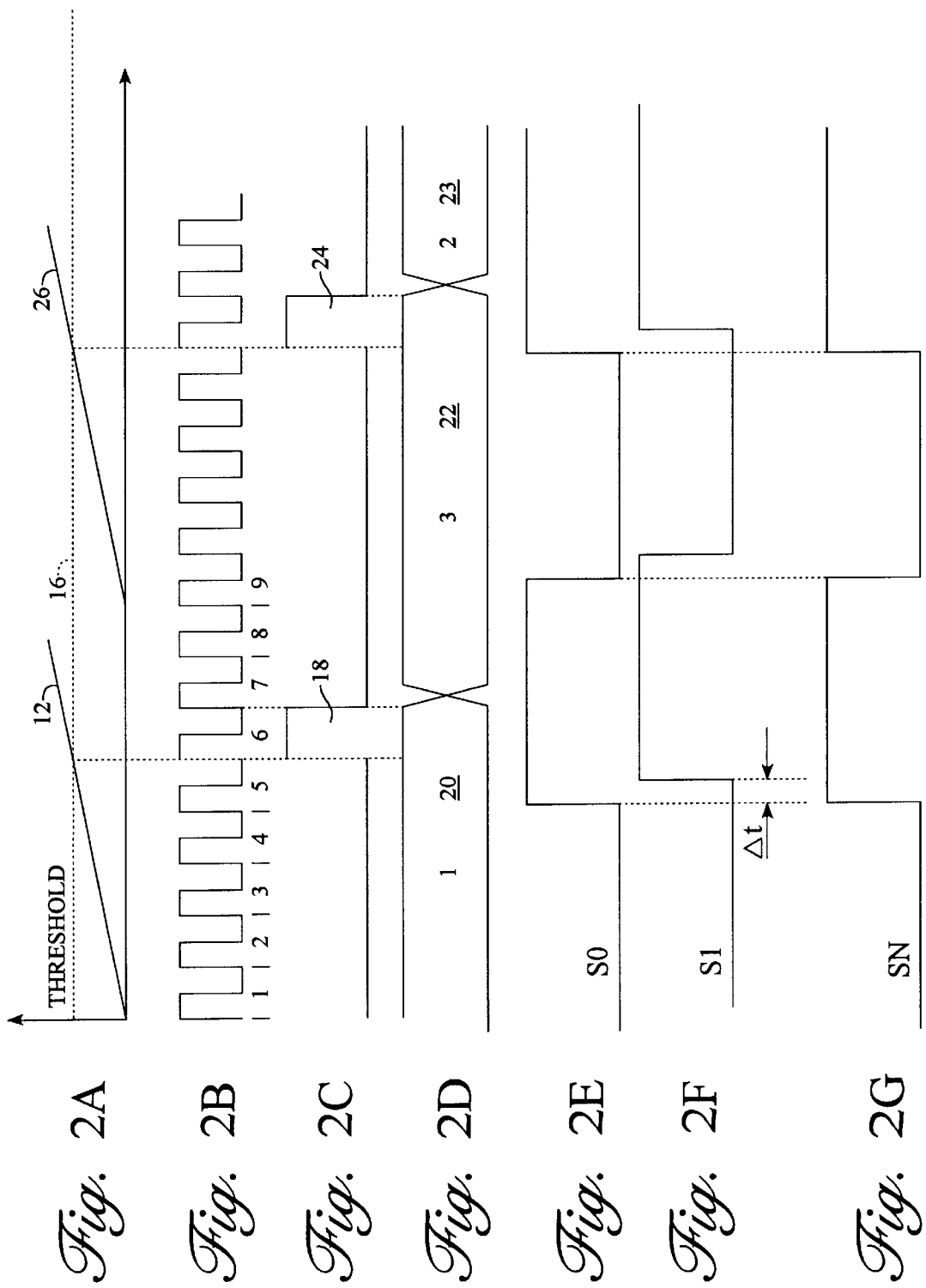

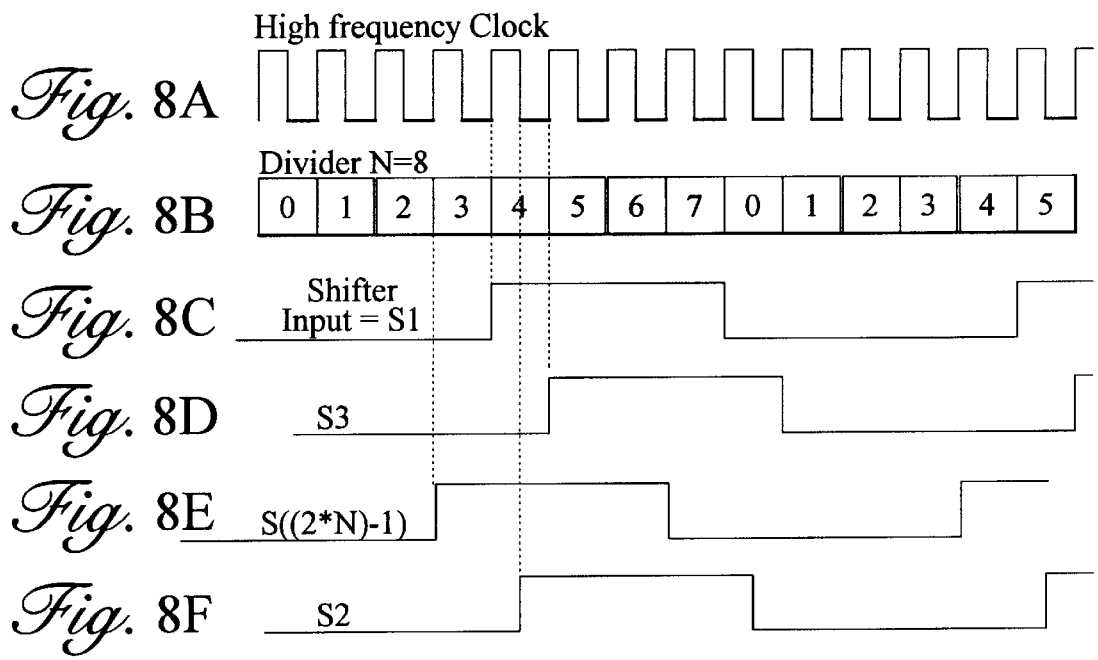
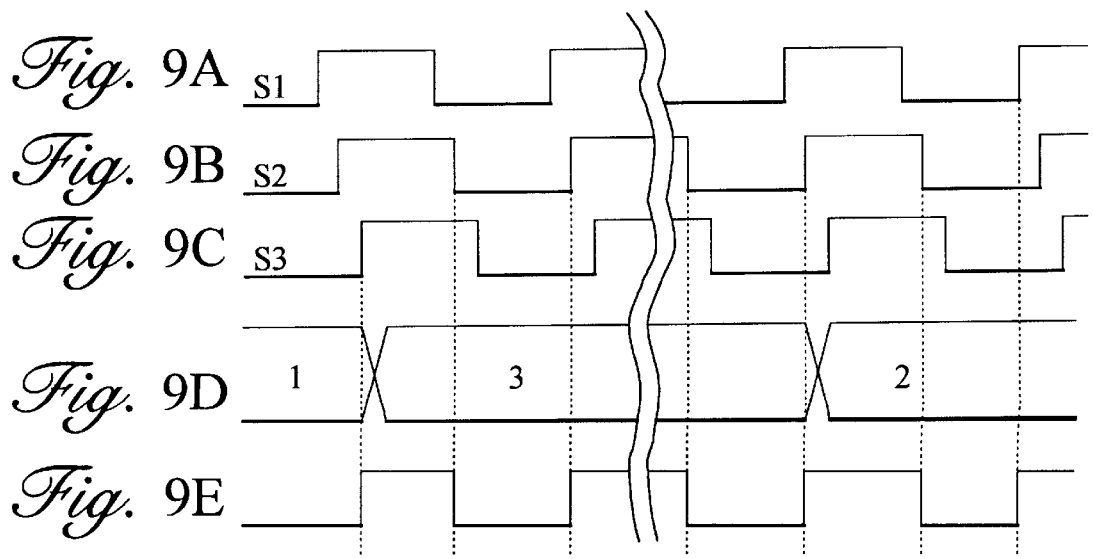

FREQUENCY SYNTHESIS CIRCUIT TUNED BY DIGITAL WORDS

TECHNICAL FIELD

The invention relates to frequency synthesizers and, more particularly, to a direct digital frequency synthesizer.

BACKGROUND ART

In a paper entitled, "A 150-MHz Direct Digital Frequency Synthesizer in 1.25-μm CMOS with—90-dBc Spurious Performance" by H. T. Nicholas et al. in IEEE Journal of Solid-State Circuits, Vol. 26, No. 12, December 1991 the authors explain that many direct digital frequency synthesizers use the modulo $2^K$ overflow property of a K-bit word accumulator to generate the phase argument of a generated output wave. Successive words of the accumulator may be mapped into successive phase values for a generated output wave.

In U.S. Pat. No. 5,656,958 P. Albert et al. use a variation of the accumulator technique described above in a frequency synthesizing device for use in digital communications where the carrier frequency is to be established with great precision. The patent discloses a circuit which employs a phase lock loop to operate on an incoming data signal. An accumulator circuit receives a digital word from a source. A variable divider circuit processes accumulator output signals to adjust the phase of the local clock based upon the contents of the digital word. Continuous changes of phase of the local clock give rise to changes in output frequency.

The circuit disclosed by P. Albert et al. is useful for the situation where a digital channel contains a subchannel or slot in which phase information of the clock is encoded with a digital word. For example, in MPEG (Motion Picture Expert's Group) data transmission, there is a subchannel known as the system clock reference (SCR) which is transmitted at least as often as every 0.7 second by the MPEG encoder. The SCR signal must be received, decoded and sent to the audio and video decoders to update internal clocks. The subchannel may be used to encode a number for use in a frequency synthesizer.

Phase lock loops are well known circuits for locking the phase of a clock signal. A phase lock loop can cancel the jitter, i.e. short term variations of the significant edges of a digital signal, which occurs in the transmission channel. Such clock recovery circuits are described in U.S. Pat. No. 4,241,308 to A. Lovelace et al.

An object of the invention was to synthesize a frequency near a reference frequency using digital techniques, with high stability and low jitter. Another object is to provide the last stage of a phase lock loop, namely a numerically controlled oscillator.

SUMMARY OF INVENTION

The above object has been achieved in a frequency synthesis circuit. One embodiment features a tunable delay line in combination with a modulo accumulator. Tuning is achieved with respect to a stable reference frequency, generated by a local oscillator, over a single clock cycle. A digital word specifies the output frequency value. The input digital word is fed to an accumulator whose value reaches periodically a threshold. This period depends on the input digital word value. This accumulator, of course, overflows. In this patent application, accumulator underflow and overflow are both called "overflow". The exact amount of delay corresponding to the phase delay signal is provided by a plurality of buffer cells, each of which driving the fan-in capacitance of the next delay cell unit and also the interconnect wire capacitance which acts as the principal delay element. A control pin for each buffer serves as a buffer strength drive modulator, allowing the load dependent delay to be variable. The control pin is driven by a charge pump having a duty cycle linked to the beginning and end of a single clock cycle of the local oscillator to insure that the total amount of delay is kept within one clock cycle. The total amount of delay is fed to a multiplexer which operates on an incoming digital word by shifting the local oscillator frequency signal by a phase delay unit each time a new increment occurs on the integrator (counter) located just before the multiplexer. This counter counts each time the first integrator reaches the threshold, even if the input digital word is fixed.

An incoming digital word is first passed through a shaping circuit which consists of an integrator and a threshold circuit. The shaping circuit is connected to a counter, serving as an accumulator, defining the successive multiplexer selection values. This would generate a series of crystal oscillator period square waveforms followed by a crystal oscillator period plus or minus (counting up or counting down or reversal phase delay order at the input of the multiplexer) the phase delay unit. This last period depends on the input digital word value. The shaping circuit and counter are clocked by the output of the multiplexer so that the next data word is not initiated or passed through the counter until the prior word is processed.

Thus, the present invention employs two feedback circuits. A first feedback circuit insures that the total amount of delay occurs within one cycle and the second feedback loop, employing the same oscillator as the first circuit, synchronizes the input shaping circuit and counter with the multiplexer output. The second feedback circuit wholly incorporates the first feedback circuit.

A second embodiment does not use real delay lines. In the second embodiment the reference frequency of a local oscillator is multiplied and fed to two shifters in phase reversal relation, with offset phases subdividing the reference frequency in the same manner as the multiple delays of the first embodiment. Once again, an input digital word is sent through an accumulator, whose overflow signal, after being integrated, addresses a multiplexer to select an appropriate phase delay for the local oscillator, giving rise to a slight change in frequency. The process is rapidly repeated with other digital words in sequence, thereby defining a new output frequency or frequencies.

BRIEF DESCRIPTION OF THE DRAWINGS

FIG. 2A is a timing plot of a linearized value versus time as the output of the input integrator in the frequency synthesis circuit of FIG. 1, with a threshold level superimposed.

FIG. 2B is a timing plot of an output waveform from the circuit of FIG. 1, illustrating a synthesized frequency signal.

FIG. 2C is a timing plot of a recovered data word in the circuit of FIG. 1.

FIG. 2D is a timing plot of data envelopes for recovered data word bits in the circuit of FIG. 1.

FIGS. 2E–2G are timing plots of delay line output signals.

FIG. 8A is a timing plot of a high frequency clock waveform used in the circuit of FIG. 7.

FIG. 8B is a timing plan for a divider used in the circuit of FIG. 7.

FIGS. 8C–8F are timing plots for shifter inputs to the dual shifters in the circuit of FIG. 7.

FIGS. 9A–9C are timing plots for shifter outputs from the shifters in the circuit of FIG. 7.

FIG. 9D is a timing plot of data envelopes recovered in the circuit of FIG. 7.

FIG. 9E is a timing plot of an output waveform from the circuit of FIG. 7, illustrating a synthesized frequency signal.

BEST MODE OF CARRYING OUT THE INVENTION

Figure 1:
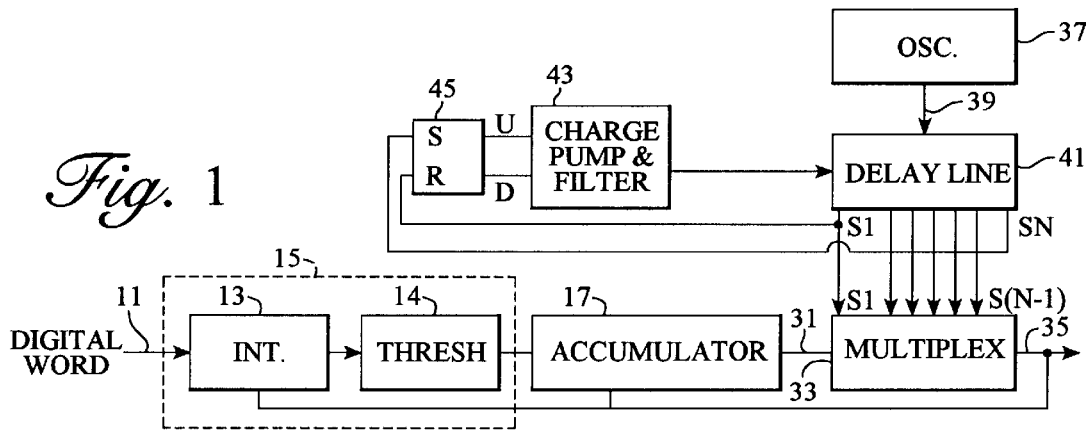
FIG. 1 is a block diagram of a first embodiment of the frequency synthesis circuit of the present invention.

With reference to FIG. 1 the first embodiment of the frequency synthesis circuit of the present invention has an input line 11 receiving a transmitted signal representing a digital word indicating the value of the desired output frequency. The frequency synthesis circuit of the present invention can establish a desired frequency in a very narrow range centered about a nominal or reference frequency of a local oscillator 37, usually corresponding to a system or data frequency.

Input line 11 feeds integrator 13 which is part of a shaping network 15. From the integrator, the incoming signal is fed to a threshold circuit 14 which goes high when the input signal is above a predefined level.

FIG. 2A shows integrated bits of a data word. Line 12, a linearized trace of the integrator output, represents a digital word input which is clocked in from the output synthesized frequency waveform. The first integrator 13 in FIG. 1 produces the ramp 12 for a duration which is specified by the digital input word value, giving the slope coefficient involving the overflow period, shown in FIG. 2B, taken from line 30, coming from the output frequency on line 35 from multiplexer 33. The threshold circuit 14 establishes a digital level, indicated by line 16 in FIG. 2A. The threshold circuit 14 is used to set a time slot in order to select a new phase delay signal. If the ramp signal 12 crosses the threshold 16, an output pulse 18 shown in FIG. 2C is generated. The pulse is a simple enable for a counter which integrates these incoming pulses in order to select a new phase delay unit shifted signal. The counting mode is not a decimal one (i.e. 0, 1, 2, 3 . . . ) but is a one bit switching mode, for example a Gray code counter or reflected binary code, in which only one bit changes per successive count. This way of counting avoids the parasitic switching of a decimal counter. In a decimal two bit counter, one can experience problems, for example, when switching from 1 to 2 because the two flip-flop outputs are not loaded with the same capacitor. If one sends this value to the multiplexer, the problems will appear on the multiplexer output. A one bit switching counter does not produce this phenomena. Then the series of binary equivalent values is as follows: 0, 1, 3, 2, 6, 7, 5, 4 for a 3 bit counter in accord with the following table.

| Gray Code (Counter) | Binary Equivalent (Mux Delay Input) |
| --- | --- |
| 000 | 000 |
| 001 | 001 |
| 011 | 010 |
| 010 | 011 |
| 110 | 100 |
| 111 | 101 |
| 101 | 110 |
| 100 | 111 |

Of course, the phase delay amount of signals must be connected in a correct order to the multiplexer in order to be sorted out correctly when the Gray code counter increases. In other words, the new selected signal must be shifted by one phase delay unit compared to the previous one. For example, S1 must be connected to input 1 of mux, S2 must be connected to input 2, S3 must be connected to input 4, not input 3, and S4 must be connected to input 3 of mux. When the counter is equal to 0, then input 1 (S1) is selected. If a pulse occurs it increases to 1 then input 2 (S2) is selected (S2=S1+unit phase delay). If a new pulse occurs, the counter reaches 3, then input 4 is selected. Input 4 is connected to S3 (S3=S2+unit phase delay) and so on. From a functional point of view the counter generates a variable (the counter value), able to select all of the phase delay signals in the correct order, i.e. each new signal is the phase delay unit shifted relative to the previous signal.

The address received by multiplexer 33 identifies the next phase delay signal to be selected from a delay line. When the delay signal is received, the multiplexer 33 outputs a frequency signal on line 35, illustrated in FIG. 2B. Returning to FIG. 1, this output signal is fed back to integrator 13 to clock in the next input word and to accumulator 17 to feed the next address to multiplexer 33.

The local oscillator 37 is set very close to the nominal frequency but not exactly at the nominal frequency. The oscillator is preferably a crystal controlled oscillator of high precision and stability. The oscillator transmits a signal to delay line 41 which has a plurality of delay taps at incrementally increasing delay unit intervals, S1, S2, . . . , SN which span one clock cycle of the local oscillator. All of the delay taps feed multiplexer 33 so that an appropriate delay can be called by the address signal fed to the multiplexer along line 31.

In one embodiment, the delay line comprises a series of buffer circuits, each associated with a load capacitor of equal value, described below. The amount of delay is established or tuned by a charge pump 43 driven by an S-R flip-flop register 45. This register is set by a signal from the highest unit of delay and reset by a signal from the lowest unit of delay. The charge pump has up/down inputs from the S-R register. In this manner, the delay is tuned to the reference clock cycle.

FIG. 2E shows a waveform with zero delay, representing the signal from the local oscillator 37 taken along line 39. FIG. 2F represents a signal with one unit of delay, Δt, where Δt resolves a specified amount of jitter in a non-ambiguous way. Successive amounts of delay exist through the maximum amount of delay, shown in FIG. 2G, representing N units of delay, a signal which is in phase with the zero delay signal of FIG. 2B. The output of the last delay cell and the signal coming out of the local oscillator are sent to a phase comparator which provides the phase difference between the two signals. The difference equals zero, as shown, when the two signals are in phase. This means that the last output signal, SN, is delayed by the period of the reference signal, i.e. the period of the local oscillator. The minimum number of delay units, or delay cells, is a function of the maximum peak to peak jitter which is to be resolved, i.e. $\Delta t$. The number of cells is given by the following formula:

$$N(\text{number of cells}) = (T\_\text{ref}/\Delta t) + 1$$

where T-ref equals the period of the local oscillator. The inverse of the period of the output waveform T\_out, is the frequency of the signal on line 35 of FIG. 1. The period of the output waveform is given by the following formula:

$$T\_\text{out} = T\_\text{ref} * [m + (1 + (1/N))]/(m+1)$$

with $m = (2^K/V) - 1$ (a modulo term)

where V=the decimal base value of the input digital word, N=the number of delay cells, K=the bit width of the accumulator (greater than the input digital word bit width), $2^K$ is equal to the base 10 number of possible states of accumulator output.
Therefore, $$F\_\text{out} = F\_\text{ref} * (2^K * N)/[(2^K * N) + V]$$

Figure 3:
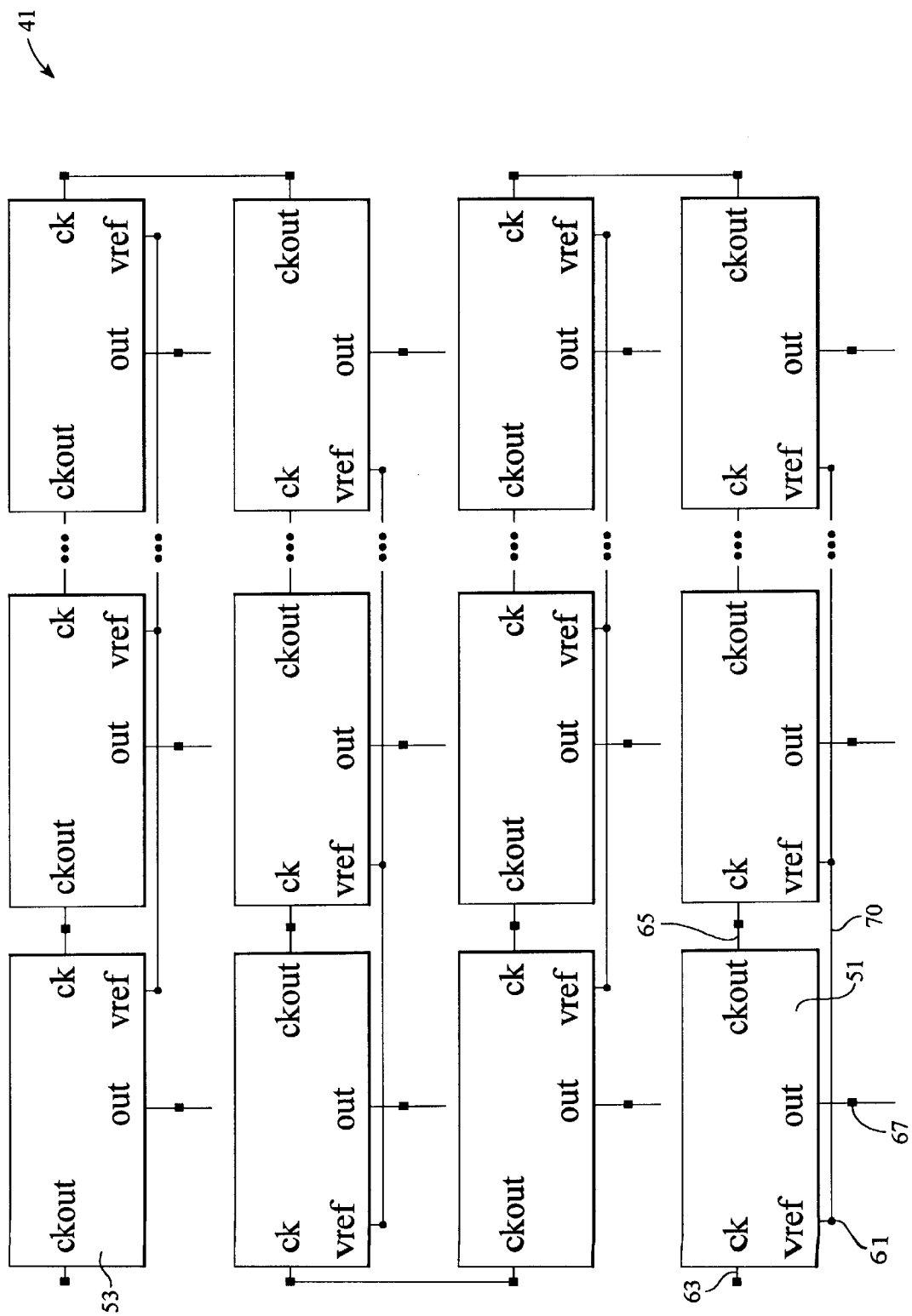
FIG. 3 is a block diagram of a delay line used in the circuit of FIG. 1.

With reference to FIG. 3, delay line is seen to comprise a plurality of logic circuits in series, starting from a first logic circuit 51 and ending in a last logic circuit 53. Each logic circuit is identical and produces a unit of delay. Each logic circuit 51 has five terminals, including a vref terminal 61, a clock terminal, labelled "ck", 63, a clock out terminal, labelled "ckout", 65, a delay output terminal 67 and a load output terminal. The ckout terminal of each logic circuit is connected to the ck terminal of the next logic circuit, so that each logic circuit is clocked by the preceding logic circuit, except for the first, which is clocked by an incoming oscillator pulse. The vref terminal, 61, of each logic circuit is connected to a common line 70 driven by a connected charge pump circuit, described below. The output terminal 67 is connected to a multiplexer 33 in a manner such that the multiplexer is able to select an output terminal providing the desired amount of delay, depending on an input digital word.

Figure 4:
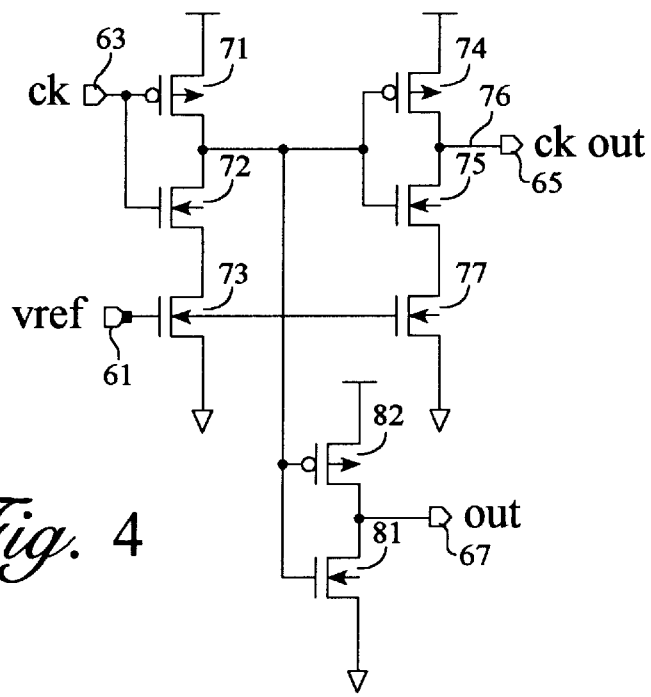
FIG. 4 is a circuit diagram of a buffer circuit used in the delay line of FIG. 2.

FIG. 4 shows the details of each of the logic circuits of FIG. 3. An incoming clock pulse at terminal 63 is fed to the CMOS first inverter pair formed by the transistor pair 71 and 72, causing momentary conduction in the n-channel transistor 73, connected to the source of transistor 72, as there is a vref drive voltage on vref input terminal 61. The incoming clock pulse at terminal 63, while switching the states of transistors 71 and 72 in the first inverter pair also switches transistors 74 and 75 of a second inverter pair, allowing an output clock pulse to emerge on line 76 between electrodes of transistors 74 and 75, as there is the vref drive voltage on the vref input terminal 61.

The strength or level of vref at terminal 61 establishes the amount of current flowing in the two parallel branches formed by transistors 71, 72, and 73 on the left side of the circuit and the transistors 74, 75 and 77 on the right side of the circuit. A strong amount of conduction on the left side provides strong drive to the right side and a short current pulse into the ckb terminal 69 which charges the load gate oxide capacitor of transistors 74, 75, 81, 82 and interconnect wire capacitor, while also providing output drive to the inverter pair of transistors 82 and 81 which isolate the output terminal 67 from the load capacitor. In this manner, the level of vref at terminal 61 governs the strength of conduction on the left side of the circuit and the amount of charge stored on fan-in capacitance and wire capacitance. The amount of charge stored governs the switching time of the right side of the circuit, thereby establishing the timing of output pulse on output terminal 67 and the ckout terminal 65.

Figure 5:
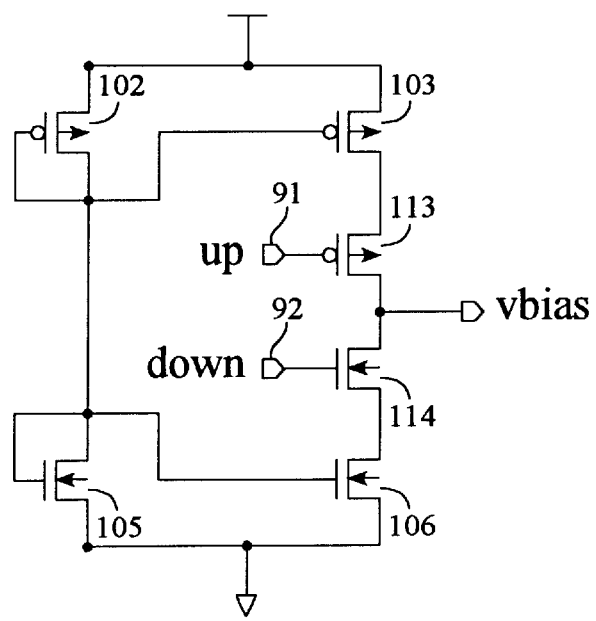
FIG. 5 is a circuit diagram of a charge pump used in the circuit of FIG. 1.

The charge pump of FIG. 5 receives UP and DOWN inputs on terminals 91 and 92 from a phase detector 45 in FIG. 1. For a phase lead there would be an UP input and for a phase lag there would be a DOWN input. These inputs adjust vbias at output terminal 93. The vbias output feeds the vref control pin 61 of the logic circuits shown in FIG. 4. The p-channel transistors 102, 103, as well as n-channel transistors 105, 106, act as current source mirror providing a positive current when UP is active, loading a built-in capacitance equal to several pF, or a negative current when DOWN is active, unloading the capacitance. A typical built-in capacitance arises from a large area of polysilicon over gate oxide in MOS devices. This charge pump and capacitance act as a filtering device, i.e. loop filter of the delay amount regulator control loop. The phase detector, the charge pump, the capacitance and the delay line itself are a PLL inside of the invention when the embodiment of the invention requires an analog portion in order to meet very aggressive jitter requirements, i.e. very low. The second embodiment of the invention does not contain such a delay amount regulator. A positive variation of output voltage will decrease the amount of delay in each of the delay circuits shown in FIG. 4 while a negative output voltage will increase the amount of delay.

Ordinarily, the amount of total delay is adjusted by the comparator 45 in FIG. 1 so that all of the delay occurs exactly within one clock cycle. In this manner, a clock may have its phase adjusted to any value within a single clock cycle. Each time the accumulator 17 increases, a new selected phase signal is selected. This new selected signal is delayed of 1 unit delay phase compared to the previous selected one. By changing the data words, the output frequency may be selectively changed. For example, by incrementing the input data word by a preset amount, the phase of the output frequency may be continuously shifted by an increasing, or decreasing, amount. This gives rise to an output frequency based upon phase shifts of the local oscillator.

Figure 6:
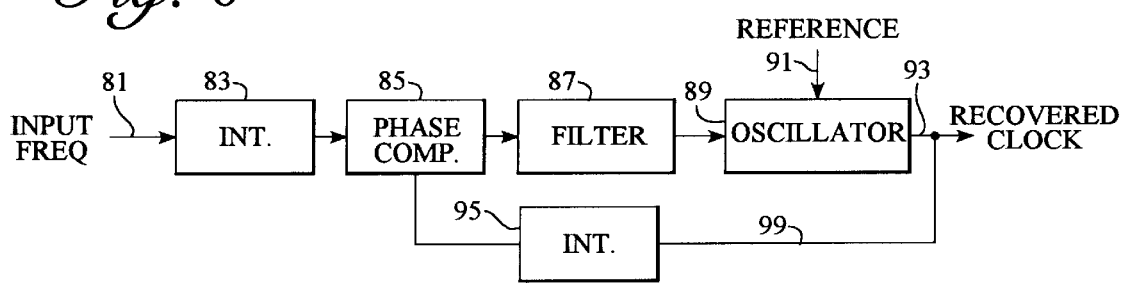
FIG. 6 is a circuit diagram of a phase lock loop employing the frequency synthesis circuit of FIG. 1 as a numerically controlled oscillator.

The circuit of FIG. 1 has been described as a stand alone circuit. However, in some communication applications an input clock signal can be derived from other sources and the circuit of FIG. 1 can be used as part of a phase lock loop circuit. Such an arrangement is shown in FIG. 6. Assume that FIG. 6 represents the receiver side of a digital data communications system. Assume further that the transmitter side is transmitting a base band signal which includes the phase of the system transmitter clock itself at a nominal frequency, where the phase of the clock signal is used as a reference for a local oscillator in the receiver at the nominal frequency. The phase signal is generated on the transmitter side by means of a phase generator (a modulo counter). This counter is periodically transmitted in a bitstream time clock and this value, a digital tuning word, represents the digital value of the phase. On the receiver side, this digital value must be recovered and filtered, in order to cope with channel disturbances. The recovered, compared and filtered signal will drive a frequency synthesizer.

The clock recovery system of a digital data transmission system must be able to provide a range of frequencies surrounding the nominal or reference signal, using the input digital word as a tuning indicator. This allows the receiver to run synchronously with the associated transmitter, which is also specified to run within a narrow range of frequencies near the nominal reference frequency.

With reference to FIG. 6 an input signal containing the digital tuning word is applied to the phase lock loop along line 81. In case the frequency is directly received on the receiver side, the input signal must be integrated first to get its phase, a digital word. If the phase is already transmitted, for example, as in an MPEG2 bitstream, then there is no need for block 83 of FIG. 6. The output of block 83 is compared with the phase of the recovered clock. In order to generate this second phase, block 95 must be fed by the frequency signal coming from the block 89. The difference between these two phases must be filtered because the received input signal is noisy due to transmission path disturbances. The received input frequency signal is composed of the average frequency signal plus noise, i.e. jitter. Block 87 filters the jitter, which is not necessary to recover the average transmitter frequency, and provides a digital word which represents this average frequency when the PLL is locked.

Phase comparator 85 transmits recovered input data to filter 87 for elimination of spurious signals and then transmitted to oscillator 89 which is a numerically controlled oscillator of the type illustrated in FIG. 1, the oscillator being tuned by the digital input word. The signal from a local oscillator, at the recovered input frequency, is applied as a reference along line 91. The numerically controlled oscillator 89 selects from available phase delays to provide a recovered clock signal along line 93. This output frequency is integrated, in order to generate the phase, by a second integrator 95 in a feedback loop 97 and transmitted back to phase comparator 85 which provides a phase lock. The available phase delays of oscillator 89 resemble the delays available in the delay line 41 of FIG. 1, or the virtual delay line described below. Selection of the desired phase delay allows tuning of oscillator 89 by input digital words. As the value of the digital words changes, the output frequency on line 93 may be varied with respect to the reference frequency on line 91.

The delay line of FIG. 1 provides actual time delay from load capacitance. It is possible to simulate delay using shift registers as described below. The shift registers provide a delay line with phase delay unit depending on the reference clock, since the effect of the delay line is the same as a real delay line, both the virtual delay line and the actual delay line will be called a delay line in the patent claims below.

Figure 7:
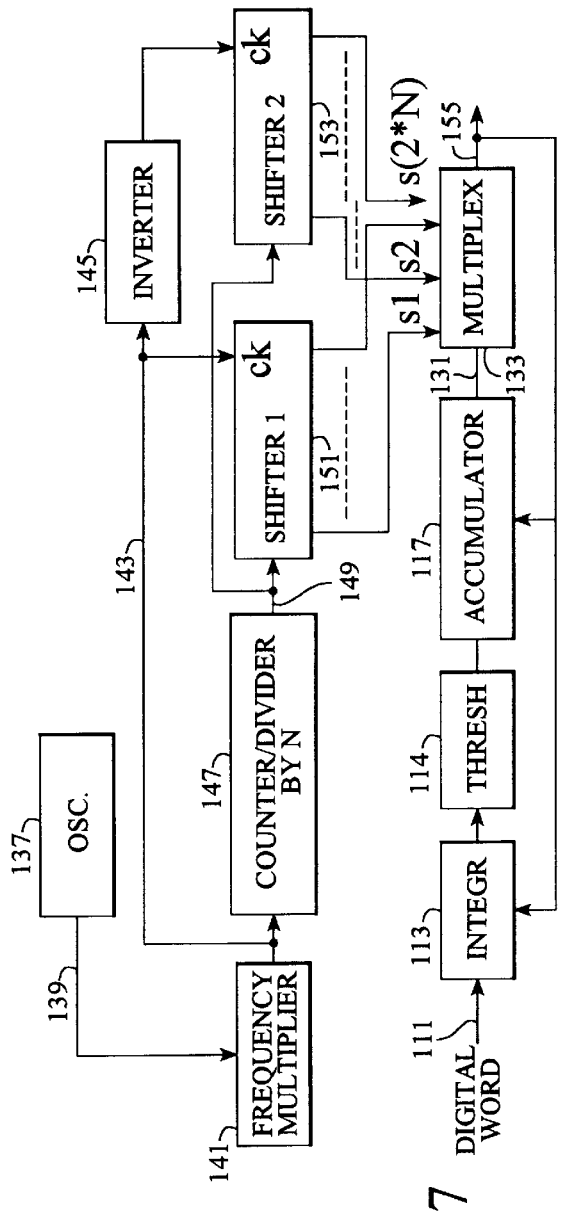
FIG. 7 is a circuit diagram of a second embodiment of the frequency synthesis circuit of the present invention.

In FIG. 7, the second embodiment of the frequency synthesis circuit of the present invention operates to receive a digital input word on line 111 which is sent to integrator 113 having an output which is fed to a threshold level circuit 114 in a manner similar to the first integrator 13 and the threshold circuit 14 in FIG. 1. The input data word is recovered in these circuits and fed to an accumulator 117, which is a modulo counter, similar to accumulator 17 in FIG. 1. The output signal from the accumulator 117, a counter overflow signal, is fed along line 131 to the multiplexer switch 133 as a select signal, operating to select one of the phase shifts S1-S(2*N).

The phase shift inputs are generated with reference to a local oscillator 137 which operates at a nominal system clock frequency. Oscillator 137 is a very stable oscillator, typically a crystal controlled oscillator. A reference clock signal is taken along line 139 and fed to a frequency multiplier 141, multiplying the system frequency by a number, Z. The high frequency clock signal along line 143 is fed as a clock signal to the first shifter 151 and through inverter 145 to the second shifter 153.

At the same time, the frequency multiplier 141 feeds its output to a divider circuit 147, which divides the multiplied frequency by N, where N-1 is number of shifts for the dual shifters and 2N represents the total number of units of delay from the dual shifters. The divided output signal is taken along line 149 and simultaneously fed to both shifters 151 and 153. The dual shifters are clocked in clock phase opposition relation because of inverter 145 and the shifted signals are fed to multiplexer 133 as individual units of phase delay spanning one complete clock cycle, with equal units of delay. The output frequency, taken along line 155 is used to clock accumulator 117 and the first integrator 113.

Figure 8:
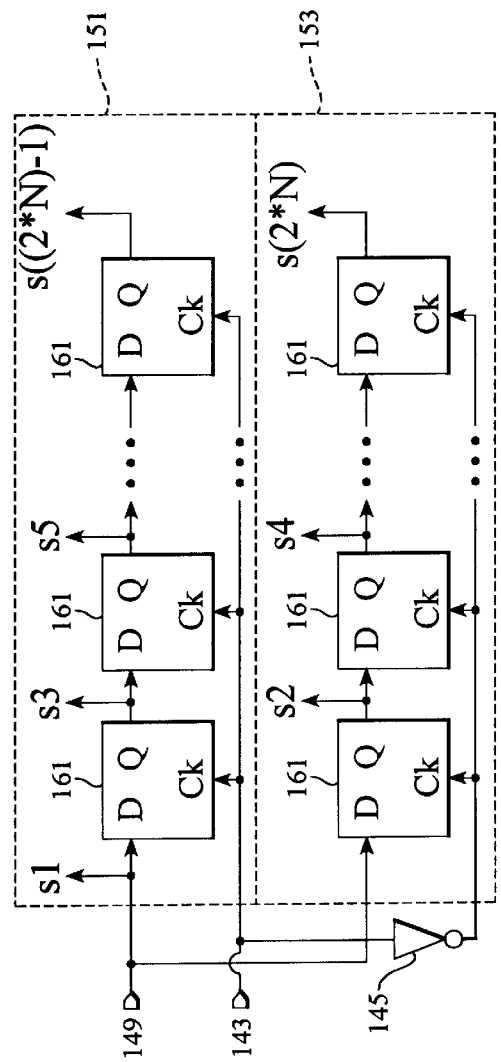
FIG. 8 is a circuit diagram of dual shifters used in the circuit of FIG. 7.

FIG. 8 shows the details of the dual shift registers. The first and second shift registers 151 and 153 both receive the same input signal along line 149 and both receive the same high frequency clock signal along line 143, except that the second shifter 153 has the high frequency clock inverted by inverter 145 so that one shift register is clocked on the rising edge of the high frequency clock and the other shifter is clocked on the falling edge. It will be seen that only a single divider has generated the needed phases. Each shift register is made up of a series of D flip-flops. The output of each flip-flop is fed to the next succeeding flip-flop and at the same time forms a unit of delay. The outputs of the shift registers on the right side of FIG. 8 are the delay signals S((2*N)-1) and S(2*N) representing maximum units of delay. The signals are fed to the multiplexer 133 in FIG. 7 thereby presenting units of delay extending from S1 to S(2*N).

Note that in the second embodiment, there is no charge pump or phase comparator to keep the delay signals in phase with the system clock because in the second embodiment all of the phases of the reference clock are synchronous to the high frequency clock. The Δt is now one-half of the high frequency clock. This is the minimum jitter which can be resolved.

FIG. 8A shows the high frequency clock signal in FIG. 7 along line 143 from frequency multiplier 141. This signal clocks the dual shifters 151 and 153. FIG. 8B shows the result of dividing the high frequency signal in counter/divider 147 where division is by eight.

FIG. 8C shows the result of division by eight where the waveform represents the shifter input for the first flipflop, as one. FIGS. 8D and 8E show subsequent signals for the first shifter. FIG. 8D shows the next input after the S1 input, clocked one high frequency clock cycle later. Note that S3 is an odd unit of delay, with even units being in the second shifter. FIG. 8D shows a waveform for the last unit of delay for the first shifter. FIG. 8E shows a waveform for the first unit of delay for the second shifter. Even units of delay are associated with the second shifter.

FIG. 9A, 9B and 9C show output waveforms from the first and second shifters corresponding to the input waveforms shown in FIGS. 8A, 8B and 8C, described above. FIG. 9D shows waveform envelopes for the accumulator circuit. Signals in the waveform envelopes are transmitted to the multiplexer with output shown in FIG. 9E. The multiplexer waveforms are taken from the available delays, as specified by a phase signal received as an overflow signal from the accumulator. The dashed lines show construction of an output waveform from the delay signals. The numbers in the waveform envelopes of FIG. 9D represent threshold overpass amounts from the accumulator encoding specified delays. For example, the number 3 specifies that S2 be used, since S2 is the third amount of delay, counting from zero. This signal will continue until changed by the next overflow signal, 2, in the next envelope of FIG. 9D.

Thus, the output waveform in FIG. 9E represents synthesized waveforms in accord with the present invention.

We claim:

1. A frequency synthesis circuit whose output frequency is determined by input digital words comprising,
an input line receiving the input digital words for tuning the output frequency of the frequency synthesis circuit,
a local oscillator producing a local oscillator signal having a local oscillator frequency,
a delay line connected to the local oscillator having a plurality of selectable delays corresponding to a plurality of incremental phase shifts relative to the local oscillator signal, spanning one cycle of the local oscillator frequency,
a multiplexer connected to receive the plurality of selectable delays from the delay line to produce an output signal corresponding to the local oscillator frequency with a selected phase delay as indicated by a digital word,
a modulo accumulator connected to the input line to receive the input digital words determinative of desired output frequency and to transmit corresponding accumulator overflow signals to a second accumulator producing second digital words transmitted to the multiplexer, whereby the multiplexer selects a delay corresponding to the accumulator overflow signals which depends on the input digital words,
whereby the local oscillator frequency, repeatedly shifted by unit phase delay corresponding to said input digital words, forms a synthesized output waveform whose output frequency depends on the input digital words.

2. The circuit of claim 1 having an input word shaping circuit including the modulo accumulator with an input connected to receive the input digital wards from a transmission path, the input word shaping circuit converting the transmitted digital words to shaped digital words.

3. The circuit of claim 1 wherein the second accumulator is a digital counter which increments by only a single digit for each count.

4. The circuit of claim 3 wherein the digital counter is a Gray code counter.

5. The circuit of claim 2 wherein the input word shaping circuit comprises an integrator in series with a threshold level detection circuit, said integrator being said modulo accumulator.

6. The circuit of claim 1 wherein the delay line comprises a plurality of buffer circuits in series, the buffer circuits connected to a charge pump loading a filter which loads each buffer of the series of buffer circuits with an increasing incremental charge, providing a phase delay to the output frequency of the local oscillator.

7. The circuit of claim 2 wherein the input word shaping circuit is connected to the multiplexer output signal for clocking.

8. The circuit of claim 1 wherein a phase lock loop is connected to said delay line in a manner to regulate the incremental delays to span one cycle of the established clock frequency.

9. The circuit of claim 1 wherein the delay line comprises a plurality of serially connected capacitively loaded circuits and a charge pump, each successive loaded circuit having an increasing amount of capacitive delay in individual unit of delay as adjusted by the charge pump.

10. The circuit of claim 1 wherein the delay line comprises at least one shifter, the shifter having a plurality of outputs dividing a clock cycle of the local oscillator into units of delay delivered to said multiplexer.

11. The circuit of claim 10 wherein the first and second shifters each comprise a plurality of D flip-flops connected in series clocked by the local oscillator signal from the local oscillator at a frequency multiplied by an integer.

12. The circuit of claim 11 wherein the local oscillator signal is supplied to the second shifter in phase reversal relation relative to the local oscillator signal supplied to the first shifter.

13. A frequency synthesis circuit whose output frequency is determined by input digital words comprising,
an input line receiving the input digital words, each word being K bits wide and establishing control of the phase of a local oscillator,
a modulo-$2^L$ accumulator connected to the input line to receive the input digital words therefrom, where L is the size in bits of said accumulator, and whose output is connected to a threshold circuit wherein the threshold circuit establishes an absolute threshold value of the accumulator and provides an accumulator overflow signals whenever the output of the accumulator exceeds the absolute threshold value, the accumulator also having a clock terminal,
a delay line connected to the local oscillator having a plurality of selectable delays corresponding to a plurality of incremental phase shifts relative to the output frequency of the local oscillator, spanning one cycle of the local oscillator frequency,
a multiplexer connected to receive the plurality of selectable delays from the delay line and to the output of the threshold circuit to produce an output signal corresponding to the local oscillator frequency with a selected phase delay as incremented by the accumulator overflow signal, the output of the multiplexer fed back to the clock terminal of the accumulator,
whereby the local oscillator frequency, repeatedly shifted by selected amounts of delay corresponding to the input digital words, forms a synthesized output waveform whose frequency depends on said input digital words.

14. The circuit of claim 13 wherein the delay line comprises a plurality of buffer circuits in series, the buffer circuits connected to a charge pump which loads each buffer of the series of buffer circuits with an increasing incremental delay, providing a phase delay to the output frequency of the local oscillator.

15. The circuit of claim 13 wherein the multiplexer is connected to the output of the threshold circuit through a digital counter that receives the accumulator overflow signal from the threshold circuit and which increments by only a single digit for each occurrence of the accumulator overflow signal, the digital counter providing a phase delay selection value to a control input o f the multiplexer.

16. The circuit of claim 13 wherein a phase lock loop is connected to said delay line in a manner to regulate the incremental delays to span one cycle of the established clock frequency.

17. The circuit of claim 13 wherein the delay line comprises a plurality of serially connected capacitively loaded circuits and a charge pump associated with a filter, each successive circuit having an increasing amount of delay in individual units of delay as adjusted by the charge pump.

18. The circuit of claim 13 wherein the local oscillator signal is supplied to the second shifter in phase reversal relation relative to the local oscillator signal supplied to the first shifter, each shifter having a plurality of outputs dividing a clock cycle of the local oscillator into units of delay delivered to said multiplexer.

19. The circuit of claim 18 wherein the first and second shifters each comprises a plurality of D flip-flops clocked by the local oscillator at a frequency multiplied by an integer.

20. The circuit of claim 18 wherein the local oscillator signal is supplied to the second shifter in phase reversal relation relative to the local oscillator signal supplied to the first shifter.

21. A frequency synthesis circuit whose output frequency is determined by input digital words, comprising:

an input line receiving said input digital words determinative of the output frequency;

a modulo accumulator coupled to the input line for integrating the values of the input digital words, the accumulator providing successive phase selection values on an output thereof;

a local oscillator producing an oscillator signal having a reference frequency;

a delay line connected to the local oscillator to receive the oscillator signal therefrom, the delay line producing a plurality of versions of the oscillator signal with different delays, the delays corresponding to a plurality of incremental phase shifts of the received oscillator signal at the reference frequency, the plurality of incremental phase shifts spanning one cycle of the oscillator signal at the reference frequency; and a multiplexer connected to the delay line to receive the plurality of phase shifted versions of the oscillator signal therefrom, the multiplexer having a control input connected to the output of the accumulator to receive successive phase selection values therefrom, the multiplexer repeatedly selecting one of said plurality of phase shifted versions of the oscillator signal as an output of the circuit in accord with the successive phase selection values, whereby the repeatedly phase shifted selections form a synthesized output frequency.

22. The circuit of claim 21 wherein the accumulator is coupled indirectly to the input line via an input word shaping circuit connected therebetween, the input word shaping circuit comprising an integrator in series with a threshold level detection circuit, the input word shaping circuit converting the received input digital words to successive pulses having a period defined by said input digital words, the accumulator comprising a digital counter incremented by each successive pulse.

23. The circuit of claim 22 wherein said digital counter is a Gray code counter.

24. The circuit of claim 22 wherein said integrator and accumulator are clocked by the output of the multiplexer.

25. The circuit of claim 21 wherein the delay line comprises a plurality of buffer circuits in series, the buffer circuits connected to a charge pump which loads each buffer of the series of buffer circuits with an increasing incremental delay, providing a phase delay to the output frequency of the local oscillator.

26. The circuit of claim 21 wherein a phase lock loop is connected to said delay line in a manner to regulate the incremental delays to span one cycle of the local oscillator frequency.

27. The circuit of claim 21 wherein the delay line comprises a plurality of serially connected capacitively loaded circuits and a charge pump associated with a filter, each successive circuit having an increasing amount of delay in individual unit of delay as adjusted by the charge pump.

28. The circuit of claim 21 wherein the delay line comprises at least one shifter, the shifter having a plurality of outputs dividing a clock cycle of the local oscillator into units of delay delivered to said multiplexer.

29. The circuit of claim 28 wherein a phase lock loop is connected to said delay line in a manner to regulate the incremental delays to span one cycle of the local oscillator frequency.

30. The circuit of claim 29 wherein the first and second shifters each comprise a plurality of D flip-flops clocked by the local oscillator signal at a frequency multiplied by an integer.

31. The circuit of claim 29 wherein the delay line comprises a plurality of serially connected capacitively loaded circuits and a charge pump, each successive loaded circuit having an increasing amount of capacitive delay in individual unit of delay as adjusted by the charge pump.

* * * * *

UNITED STATES PATENT AND TRADEMARK OFFICE
CERTIFICATE OF CORRECTION

PATENT NO : 5,977,805
DATED : November 2, 1999
INVENTOR(S): Alain Vergnes et al.

It is certified that error appears in the above-identified patent and that said Letters Patent is hereby corrected as shown below:

Col. 8, line 32, "The At is now" should read -- The Δt is now --.

Claim 1, col. 9, line 19, "of desired" should read -- of a desired --.

Claim 2, col. 9, line 34, "transmitted digital" should read -- transmitted input digital --.

Signed and Sealed this

Twenty-seventh Day of March, 2001

Attest:

NICHOLAS P. GODICI

Attesting Officer

Acting Director of the United States Patent and Trademark Office